(12) United States Patent
Jang et al.

(10) Patent No.: US 11,380,124 B2
(45) Date of Patent: Jul. 5, 2022

(54) ELECTRONIC APPARATUS

(71) Applicant: Samsung Display Co., Ltd., Yongin-Si (KR)

(72) Inventors: Namjin Jang, Hwaseong-si (KR); Minseop Kim, Cheonan-si (KR); Tae-Eun Kim, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 217 days.

(21) Appl. No.: 16/884,862

(22) Filed: May 27, 2020

(65) Prior Publication Data

US 2020/0394377 A1 Dec. 17, 2020

(30) Foreign Application Priority Data

Jun. 11, 2019 (KR) .................... 10-2019-0068877

(51) Int. Cl.
*G06V 40/13* (2022.01)
*H05K 1/18* (2006.01)
*H05K 1/02* (2006.01)

(52) U.S. Cl.
CPC ....... *G06V 40/1318* (2022.01); *H05K 1/0277* (2013.01); *H05K 1/181* (2013.01); *H05K 2201/10128* (2013.01); *H05K 2201/10151* (2013.01)

(58) Field of Classification Search
CPC .......... G06V 40/1318; G06V 40/1306; G06V 40/12; H05K 1/0277; H05K 1/181; H05K 2201/10128; H05K 2201/10151; H04M 1/026; H04M 1/0249; H04M 2201/34; H04M 2250/12

See application file for complete search history.

(56) References Cited

U.S. PATENT DOCUMENTS

| | | | |
|---|---|---|---|
| 10,229,961 B2 | 3/2019 | Choi et al. | |
| 10,283,736 B2 | 5/2019 | Bae et al. | |
| 2017/0045918 A1* | 2/2017 | Han | G06F 1/1684 |
| 2017/0300736 A1* | 10/2017 | Song | G06V 40/1312 |
| 2019/0087630 A1* | 3/2019 | Seo | G06V 40/40 |

FOREIGN PATENT DOCUMENTS

| | | |
|---|---|---|
| KR | 20-0473428 | 7/2014 |
| KR | 10-2018-0008965 | 1/2018 |
| KR | 10-2016-0110673 | 9/2018 |

* cited by examiner

*Primary Examiner* — Premal R Patel
(74) *Attorney, Agent, or Firm* — F. Chau & Associates, LLC

(57) ABSTRACT

An electronic apparatus includes a display panel including a front surface and a rear surface opposite to the front surface. A lower panel includes a plurality of sheets stacked on the rear surface of the display panel and an opening penetrating the sheets. The opening exposes a portion of a rear surface of a first sheet that has a front surface opposite to the exposed portion of the rear surface that contacts the display panel. A fingerprint sensing unit includes a fingerprint sensor positioned in the opening and a sensing circuit board connected to the fingerprint sensor. The exposed portion of the rear surface of the first sheet contacts a portion of the sensing circuit board.

21 Claims, 12 Drawing Sheets

ELECTRONIC APPARATUS

CROSS-REFERENCE TO RELATED APPLICATION

This application claims priority under 35 U.S.C. § 119 to Korean Patent Application No. 10-2019-0068877, filed on Jun. 11, 2019 in the Korean Intellectual Property Office, the disclosure of which is incorporated by reference in its entirety herein.

1. TECHNICAL FIELD

The present disclosure herein relates to an electronic apparatus and more particularly, to an electronic apparatus with improved reliability.

2. DISCUSSION OF RELATED ART

An electronic apparatus may provide various functions for communicating with a user. For example, the electronic apparatus may display an image to provide information to a user or may sense the user's input.

Electronic apparatuses may also include a function for sensing a user's fingerprint. Fingerprint recognition methods may include a capacitive method for sensing a change in capacitance between electrodes, an optical method for sensing incident light by using a light sensor, and an ultrasonic method for sensing vibration by using a piezoelectric material. An electronic apparatus may include a fingerprint sensing unit for sensing a fingerprint on a rear surface of a display panel.

SUMMARY

The present disclosure may provide an electronic apparatus including a fingerprint sensing unit.

In an exemplary embodiment of the present inventive concepts, an electronic apparatus may include a display panel including a front surface and a rear surface opposite to the front surface. A lower panel includes a plurality of sheets stacked on the rear surface of the display panel and an opening penetrating the sheets. The opening exposes a portion of a rear surface of a first sheet that has a front surface opposite to the exposed portion of the rear surface that contacts the display panel. A fingerprint sensing unit includes a fingerprint sensor positioned in the opening and a sensing circuit board connected to the fingerprint sensor. The exposed portion of the rear surface of the first sheet contacts a portion of the sensing circuit board.

In an exemplary embodiment, the sheets of the lower panel may include a first sheet comprising a first functional layer having a cushion function and a first adhesive layer disposed on the first functional layer, a second sheet comprising a second functional layer disposed on the first adhesive layer and having a heat dissipation function and a second adhesive layer disposed on the second functional layer, and a third sheet comprising a third functional layer disposed on the second adhesive layer and having a light blocking function and a third adhesive layer disposed on the third functional layer.

In an exemplary embodiment, the first sheet may include a first opening in the first sheet, a second opening in the second sheet and a third opening in the third sheet. The area of the second opening and the third opening is greater than the area of the first opening.

In an exemplary embodiment, a thickness of the lower panel overlapping with the exposed area may be equal to or less than a thickness of the fingerprint sensing unit.

In an exemplary embodiment, a height from the rear surface of the display panel to the sensing circuit board overlapping with the fingerprint sensor may be equal to a height from the rear surface of the display panel to the sensing circuit board overlapping with the exposed area.

In an exemplary embodiment, a height from the rear surface of the display panel to the sensing circuit board overlapping with the fingerprint sensor may be greater than a height from the rear surface of the display panel to the sensing circuit board overlapping with the exposed area.

In an exemplary embodiment, the sensing circuit board may be bent in a direction from the fingerprint sensor toward the exposed area.

In an exemplary embodiment, the sensing circuit board overlapping with the exposed area may be coupled to the first sheet by the first adhesive layer.

In an exemplary embodiment, the electronic apparatus may further include a main circuit board connected to the front surface of the display panel and bent toward the rear surface of the display panel. The sensing circuit board may be connected to the main circuit board.

In an exemplary embodiment, the sensing circuit board may include a first connection portion connected to the fingerprint sensor, a second connection portion connected to the main circuit board, and a grip portion disposed between the first connection portion and the second connection portion. The grip portion may have a predetermined curvature.

In an exemplary embodiment, the fingerprint sensing, unit may further include an adhesive portion coupling the fingerprint sensor to the rear surface of the display panel.

In an exemplary embodiment, the opening may be spaced apart from the adhesive portion and may have a closed-line shape surrounding an edge of the fingerprint sensor.

In an exemplary embodiment of the present inventive concepts, a display panel includes a front surface and a rear surface opposite to the front surface. A fingerprint sensing unit includes a fingerprint sensor disposed on the rear surface of the display panel and a sensing circuit board connected to the fingerprint sensor. A lower panel is disposed on the rear surface of the display panel and includes an exposed area overlapping with the sensing circuit board. The fingerprint sensor is positioned within an opening in the lower panel. A thickness of the lower panel in the exposed area is equal to or less than a thickness of the fingerprint sensing unit.

In an exemplary embodiment, the lower panel may include a first sheet comprising a first functional layer having a cushion function and a first adhesive layer disposed on the first functional layer, a second sheet comprising a second functional layer disposed on the first adhesive layer and having a heat dissipation function and a second adhesive layer disposed on the second functional layer, and a third sheet comprising a third functional layer disposed on the second adhesive layer and having a light blocking function, and a third adhesive layer disposed on the third functional layer.

In an exemplary embodiment, the first adhesive layer of the exposed area may be exposed by removal of portions of the second and third sheets.

In an exemplary embodiment, the sensing circuit board overlapping with the exposed area may be coupled to the first sheet by the first adhesive layer.

In an exemplary embodiment, a height from the rear surface of the display panel to the sensing circuit board overlapping with the fingerprint sensor may be equal to a height from the rear surface of the display panel to the sensing circuit board overlapping with the exposed area.

In an exemplary embodiment, a height from the rear surface of the display panel to the sensing circuit board overlapping with the fingerprint sensor may be greater than a height from the rear surface of the display panel to the sensing circuit board overlapping with the exposed area.

In an exemplary embodiment, the sensing circuit board may be bent in a direction from the fingerprint sensor toward the exposed area.

In an exemplary embodiment, the fingerprint sensing unit may further include an adhesive portion coupling the fingerprint sensor to the rear surface of the display panel. The adhesive portion may be disposed along an edge of the fingerprint sensor.

BRIEF DESCRIPTION OF THE DRAWINGS

The accompanying drawings are included to provide a further understanding of the present inventive concepts, and are incorporated in and constitute a part of this specification. The drawings illustrate exemplary embodiments of the present inventive concepts and, together with the description, serve to explain principles of the inventive concepts. In the drawings.

DETAILED DESCRIPTION OF THE EXEMPLARY EMBODIMENTS

Figure 1A:
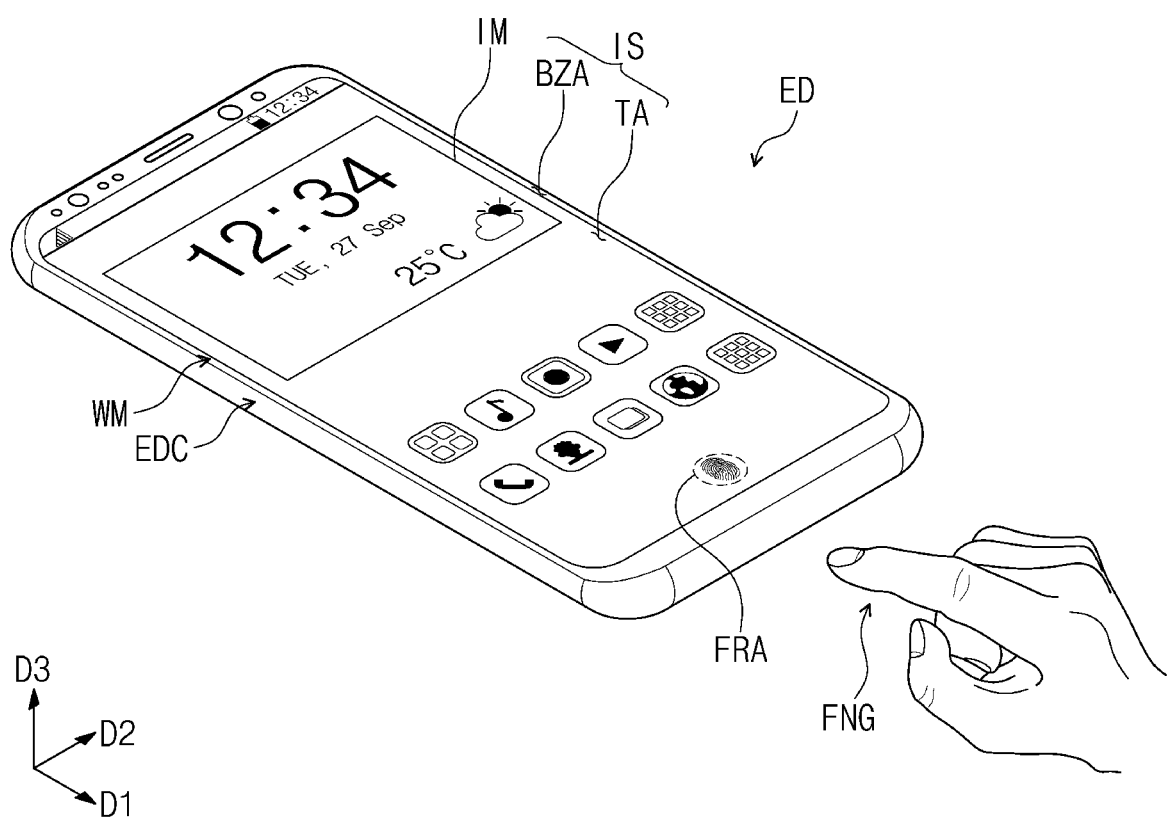
FIG. 1A is a perspective view illustrating an electronic apparatus according to an exemplary embodiment of the present inventive concepts.

The present inventive concepts now will be described more fully hereinafter with reference to the accompanying drawings, in which various exemplary embodiments are shown. The present inventive concepts may, however, be embodied in many different forms, and should not be construed as limited to the exemplary embodiments set forth herein. Like reference numerals refer to like elements throughout.

It will be understood that when an element such as a layer, region or substrate is referred to as being "on" another element, it can be directly on the other element or intervening elements may be present. In contrast, the term "directly" means that there are no intervening elements. As used herein, the term "and/or" includes any and all combinations of one or more of the associated listed items.

The terminology used herein is for the purpose of describing particular exemplary embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath", "below", "lower", "above", "upper" and the like, may be used herein for ease of description describe the relationship of element(s) or feature(s) to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings herein.

"About" or "approximately" as used herein is inclusive of the stated value and means within an acceptable range of deviation for the particular value as determined by one of ordinary skill in the art, considering die measurement in question and the error associated with measurement of the particular quantity (e.g., the limitations of the measurement system).

Exemplary embodiments are described herein with reference to cross-sectional illustrations and/or plan illustrations that are idealized exemplary illustrations. In the drawings, the thicknesses of layers and regions may be exaggerated for clarity. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of the exemplary embodiments. Hereinafter, exemplary embodiments of the present inventive concepts will be described in detail with reference to the accompanying drawings.

Figure 1B:
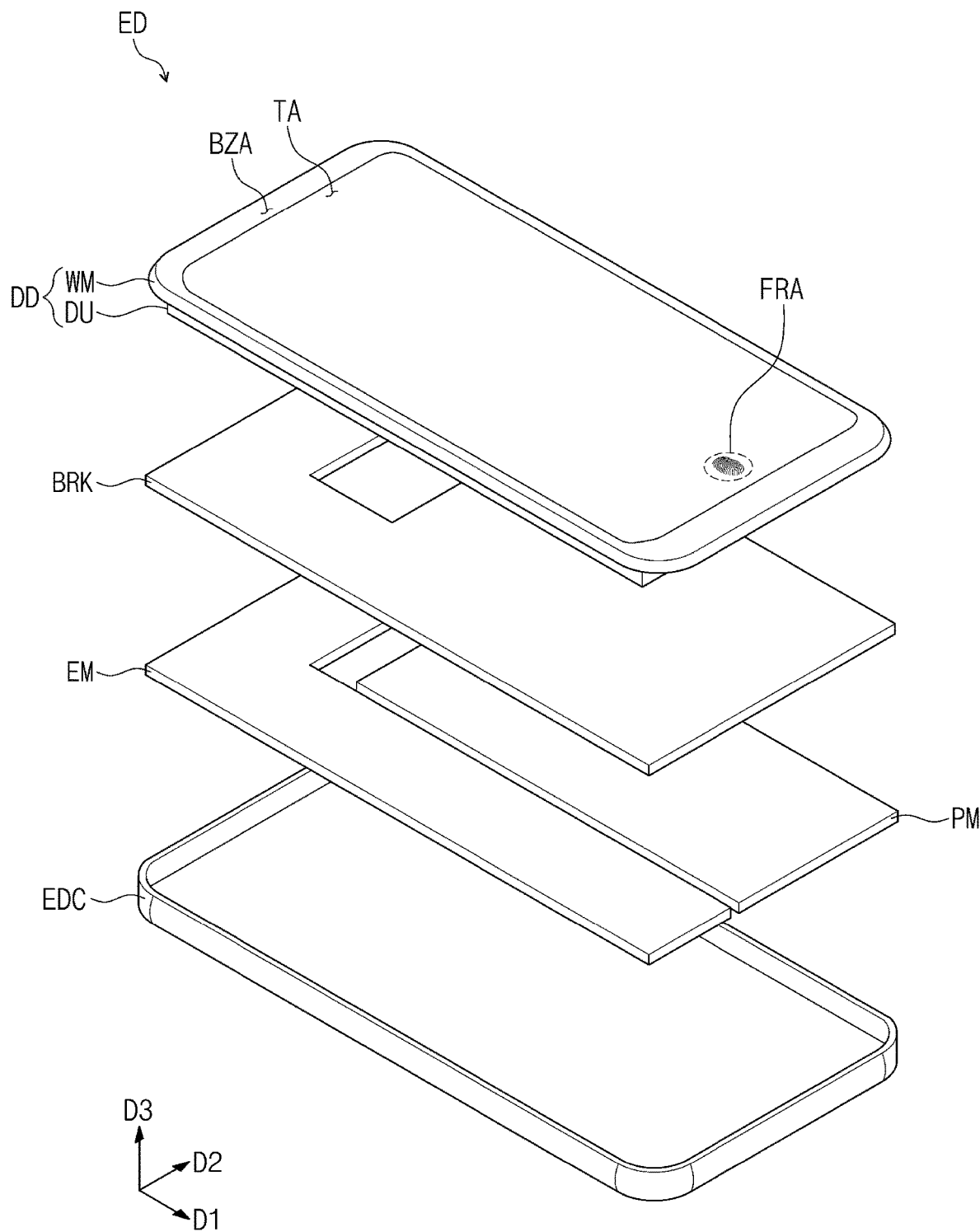
FIG. 1B is an exploded perspective view illustrating the electronic apparatus of FIG. 1A according to an exemplary embodiment of the present inventive concepts.
Figure 2:
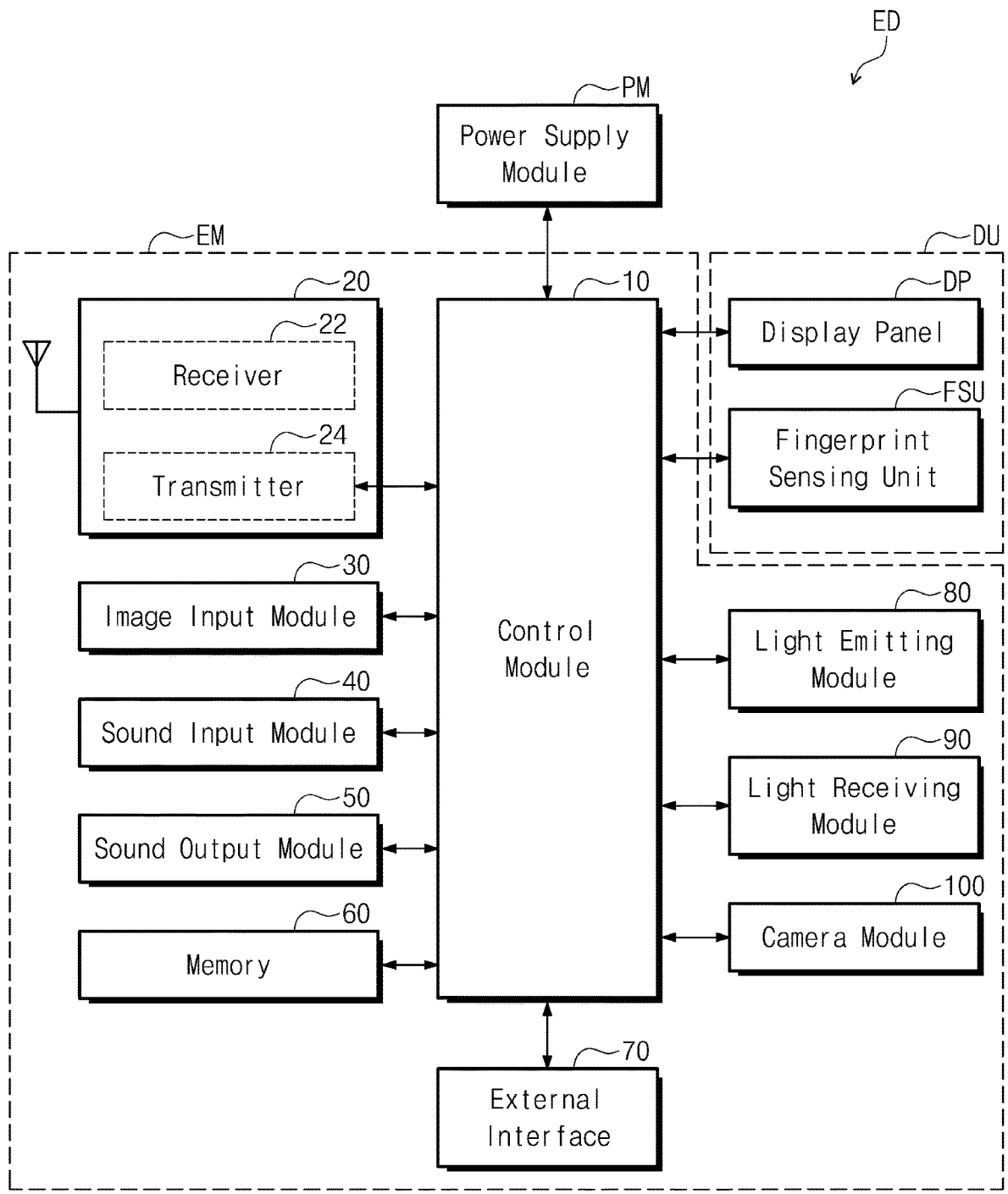
FIG. 2 is a block diagram of the electronic apparatus of FIG. 1A according to an exemplary embodiment of the present inventive concepts.

FIG. 1A is a perspective view illustrating an electronic apparatus according to an exemplary embodiment of the present inventive concepts. FIG. 1B is an exploded perspective view illustrating, the electronic apparatus of FIG. 1A. FIG. 2 is a block diagram of the electronic apparatus of FIG. 1A.

An electronic apparatus ED may be activated by an electrical signal. In accordance with the exemplary embodiments, the electronic apparatus ED may be in various forms, including a tablet, a notebook computer, a personal computer, a smart television, a smart phone, etc. In the present exemplary embodiment, the electronic apparatus ED is a smart phone. However, exemplary embodiments of the present inventive concepts are not limited thereto.

The electronic apparatus ED may display an image IM on a display surface IS that extends in first and second directions D1 and D2. In an exemplary embodiment, the display surface IS on which the image IM is displayed may correspond to a front surface of the electronic apparatus ED (e.g., a top surface in the third direction D3). The image IM may include a dynamic image, a static image or a combination thereof. In FIG. 1A, a time display box and application icons are illustrated as an example of the image IM.

In the present exemplary embodiment, the front surface (e.g., a top surface in the third direction D3) and a rear surface (e.g., a bottom surface in the third direction D3) of each component may be defined based on a direction (e.g., the third direction D3) in which the image IM is displayed which may be the front surface. The front surface and the rear surface may be opposite to each other in the third direction D3, and a normal direction of each of the front surface and the rear surface may be parallel to the third direction D3.

A distance between the front surface and the rear surface in the third direction D3 may correspond to a thickness or height of the electronic apparatus ED in the third direction D3. However, directions indicated by the first to third directions D1, D2 and D3 are relative concepts and may be changed into other directions. Hereinafter, the first to third directions are the directions indicated by the first to third directions D1, D2 and D3 illustrated in FIG. 1A, respectively.

The display surface IS (e.g., the front surface) of the electronic apparatus ED may be divided into a transmission area TA and a bezel area BZA. The transmission area TA may be an area in which the image IM is displayed. A user may view the image IM through the transmission area TA. In the present exemplary embodiment, the transmission area TA has a quadrilateral (or rectangular) shape having rounded corners. However, exemplary embodiments of the present inventive concepts are not limited thereto and the shape of the transmission area TA may have various different shapes in other exemplary embodiments.

The bezel area BZA may be adjacent to the transmission area TA. For example, the bezel area BZA may sun and the transmission area TA in the first direction D1 and/or second direction D2. The bezel area BZA may have a predetermined color. The shape of the transmission area TA in a plan view (e.g., when viewed from the third direction D3) may be substantially defined by the bezel area BZA. However, exemplary embodiments of the present inventive concepts are not limited thereto. In other exemplary embodiments, the bezel area BZA may be adjacent to only one side of the transmission area TA or may be omitted. The electronic apparatus ED according to the present inventive concepts may be variously embodied and is not limited to a specific embodiment.

The electronic apparatus ED may sense a user's fingerprint FNG applied from the outside. Thus, the electronic apparatus ED may provide a fingerprint sensing area FRA in the display surface IS. In the present exemplary embodiment, the fingerprint sensing area ERA is provided on a portion of the transmission area TA (e.g., a lower portion of the transmission area in the first direction D1) in which the image IM is displayed. However, exemplary embodiments of the present inventive concepts are not limited thereto. For example, in other exemplary embodiments, the fingerprint sensing area FRA, may be provided in the bezel area BZA, may be provided on the entire transmission area TA, or may be provided on the entire display surface IS. The electronic apparatus ED may sense the fingerprint FNG provided in the fingerprint sensing area FRA.

A user's fingerprint FNG may include a surface state (e.g., a degree of surface uniformity or topography) of a user's hand or finger. However, exemplary embodiments of the present inventive concepts are not limited thereto. In another exemplary embodiment, when an input (e.g., a touch) of an object or another portion of the user's body is provided to the electronic apparatus ED, the electronic apparatus ED may sense information on a surface of the object or other portion of the user's body.

Referring to FIGS. 1B and 2, the electronic apparatus ED may include a display module DD, an electronic module EM, a power supply module PM, a bracket BRK and an outer case EDC. Schematic drawings of the components of the electronic apparatus ED are illustrated in FIG. 1B.

The display module DD may include a window member WM and a display unit DU. The window member WM may form the exterior of the electronic apparatus ED in an assembled state, as illustrated in FIG. 1A. The window member WM may protect internal components of the electronic apparatus ED from an external impact and may be the component that provides the display surface IS of the electronic apparatus ED.

The display unit DU may be disposed on a rear surface (e.g., in the third direction D3) of the window member WM. The display unit DU may include a display panel DP and a fingerprint sensing unit FSU (see FIG. 3A). The display panel DP may be a component which generates the image IM. The image IM generated from the display panel DP may be displayed on the display surface IS through the transmission area TA and thus may be visible to a user.

The fingerprint sensing unit FSU may sense a user's fingerprint FNG applied from the outside. As described above, the fingerprint sensing unit FSU may sense a user's fingerprint FNG provided to the fingerprint sensing area FRA. This will be described later in detail.

Figure 3A:
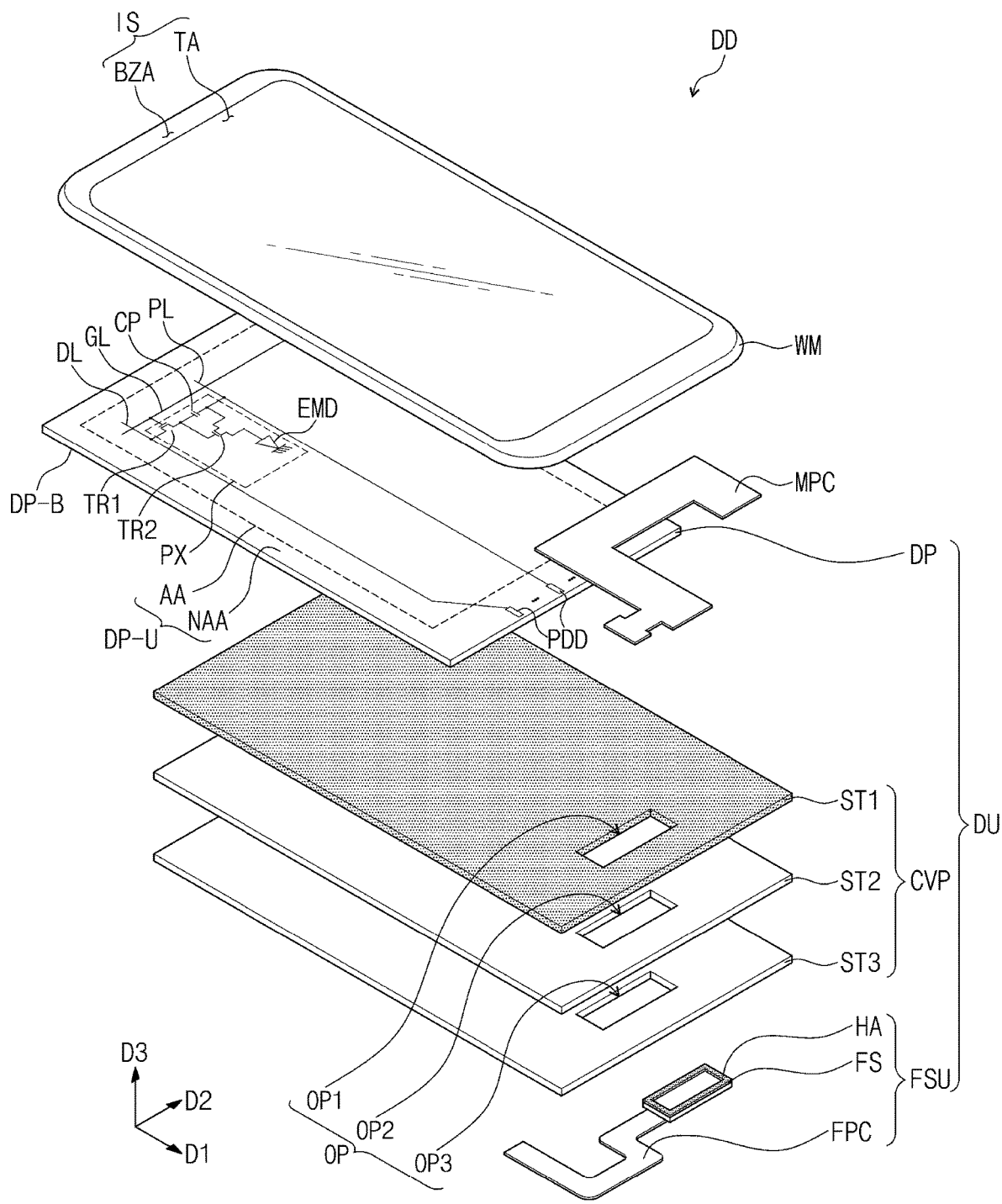
FIG. 3A is an exploded perspective view illustrating some of components of FIG. 2 according to an exemplary embodiment of the present inventive concepts.

The display unit DU may be electrically connected to the electronic module EM through a main circuit board MPC (see FIG. 3A). The display unit DU may receive data concerning the image IM to be displayed through the electronic module EM. In addition, the display unit DU may provide data on a sensed fingerprint FNG of a user to the electronic module EM and may provide information processed based on the data to a user.

The power supply module PM may supply power necessary for overall operations of the electronic apparatus ED. The power supply module PM may include a battery module.

The bracket BRK may be coupled to the display module DD and/or the outer case EDC to divide an interior space of the electronic apparatus ED formed between the outer case EDC and the window member WM. The bracket BRK may provide a space in which other components re disposed. In addition, the bracket BRK may support the display module DD to secure the position of the display module DD and prevent shaking or inadvertent movement of the display module. A coupling recess corresponding to a shape of the electronic module EM may be defined in the bracket. BRK to secure the positioning of the electronic module EM. The bracket BRK may include a metal or plastic member. A single bracket BRK is illustrated as an example. However, in other exemplary embodiments, the electronic apparatus ED may include a plurality of brackets BRK.

The outer case EDC may be coupled to the bracket BRK and/or the display module DD. In the exemplary embodiment shown in FIG. 1B, the outer case EDC may form the exterior of the electronic apparatus ED together with the window member WM. In the exemplary embodiment shown in FIG. 1B, an outer case EDC having a single integral body is illustrated. However, exemplary embodiments of the present inventive concepts are not limited thereto. In another exemplary embodiment, the outer case EDC may include a plurality of bodies assembled with each other. The outer case EDC may include a plurality of frames and/or plates, which are formed of glass, plastic, and/or a metal.

The electronic module EM may be mounted on a motherboard and may include various functional modules for operating the electronic apparatus ED. The motherboard may be electrically connected to the main circuit board MPC (see FIG. 3A) of the display unit DU through a connector. In an exemplary embodiment, the motherboard may include a rigid printed circuit board.

Referring to FIG. 2, the electronic module EM may include a control module 10, a wireless communication module 20, an image input module 30, a sound input module 40, a sound output module 50, a memory 60, an external interface 70, a light emitting module 80, a light receiving module 90, and/or a camera module 100. In an exemplary embodiment, some of the components (e.g., the modules) may not be mounted on the motherboard but may be electrically connected to the motherboard through a flexible circuit board.

The control module 10 may control overall operations of the electronic apparatus ED. The control module 10 may include a microprocessor. For example, the control module 10 may activate or inactivate the display module DD. The control module 10 may control the image input module 30, the sound input module 40, and the sound output module 50 on the basis of a touch signal received from the display module DD.

The wireless communication module 20 may transmit/receive a wireless signal to/from other terminal(s) by using Bluetooth or Wi-Fi. The wireless communication module 20 may transmit/receive a voice signal by using a general communication line. The wireless communication module 20 may include a transmitter 24 which is configured to modulate a signal to be transmitted and to transmit the modulated signal, and a receiver 22 which is configured to demodulate a received signal.

The image input module 30 may process image signals to convert the image signals into image data usable in the display module DD. The sound input module 40 may receive an external sound signal through a microphone in a recording mode or a voice recognition mode and may convert the received sound signal into electrical sound data. The sound output module 50 may convert sound data received from the wireless communication module 20 or sound data stored in the memory 60 and may output the convened sound data to the outside.

The external interface 70 may be connected to, and interface with, an external charger, a cable wireless data port, and/or a card socket (e.g., a memory card or a SIM/UIM card).

The light emitting module 80 may generate light and may output the generated light. In an exemplary embodiment, the light emitting module 80 may output infrared light. The light emitting module 80 may include a light emitting diode (LED) element. The light receiving module 90 may sense infrared light. The light receiving module 90 may be activated when sensing infrared light that is greater than or equal to a predetermined level of intensity. The light receiving module 90 may include a CMOS sensor. After the infrared light generated in the light emitting module 80 is outputted, the infrared light may be reflected by an external object (e.g., a user's finger or face) and the reflected infrared light may be incident to the light receiving module 90. The camera module 100 may acquire an external image.

Figure 3B:
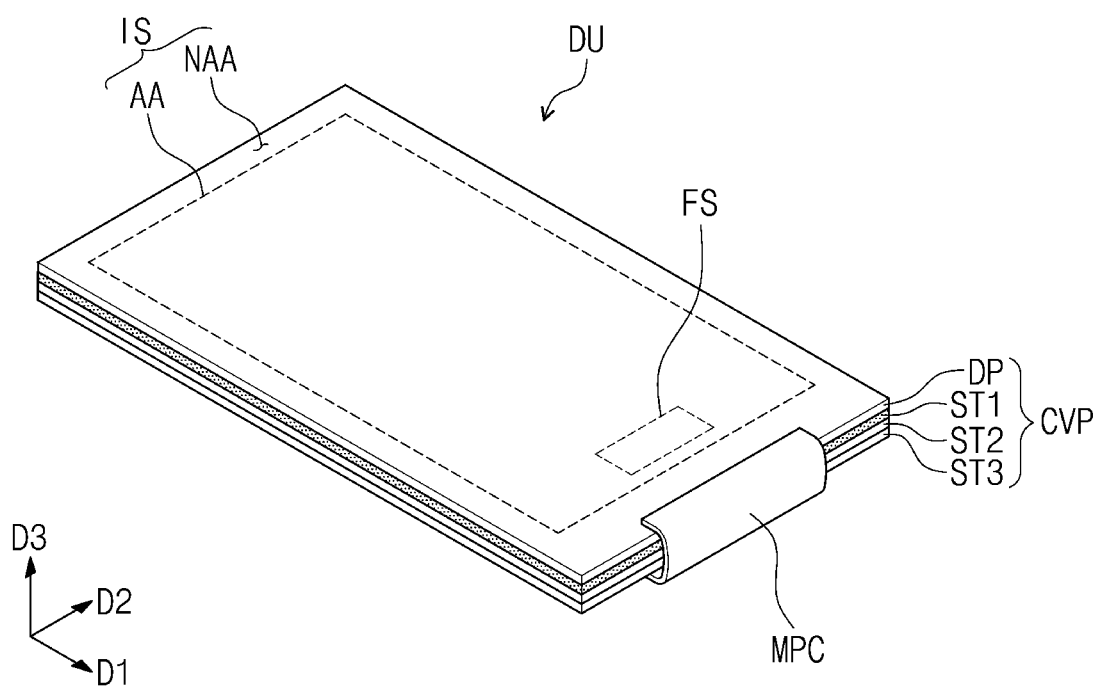
FIG. 3B is a perspective view of some of the components of FIG. 3A according to an exemplary embodiment of the present inventive concepts.
Figure 4:
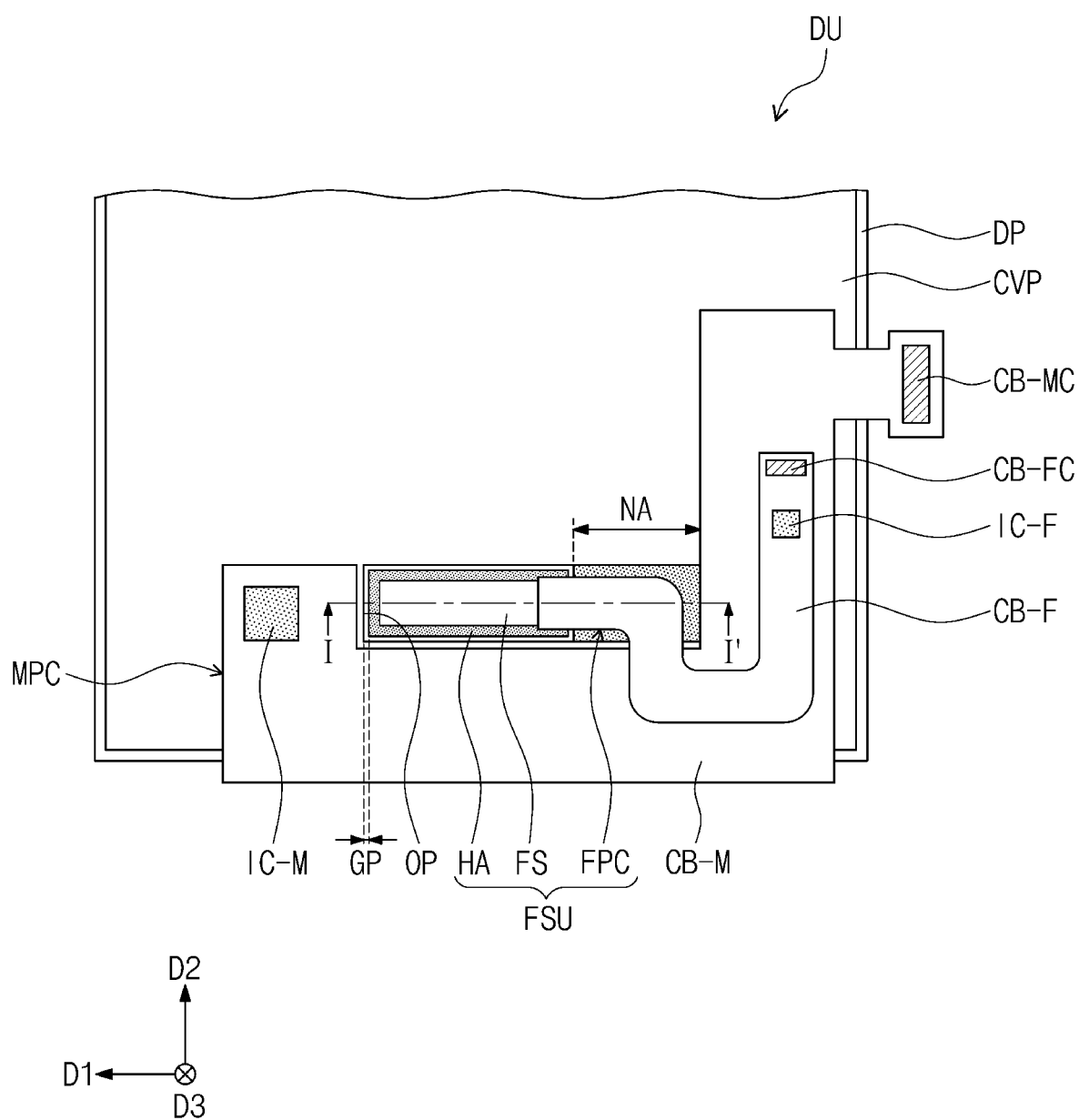
FIG. 4 is a rear elevational view illustrating a portion of a display unit according to an exemplary embodiment of the present inventive concepts.
Figure 5:
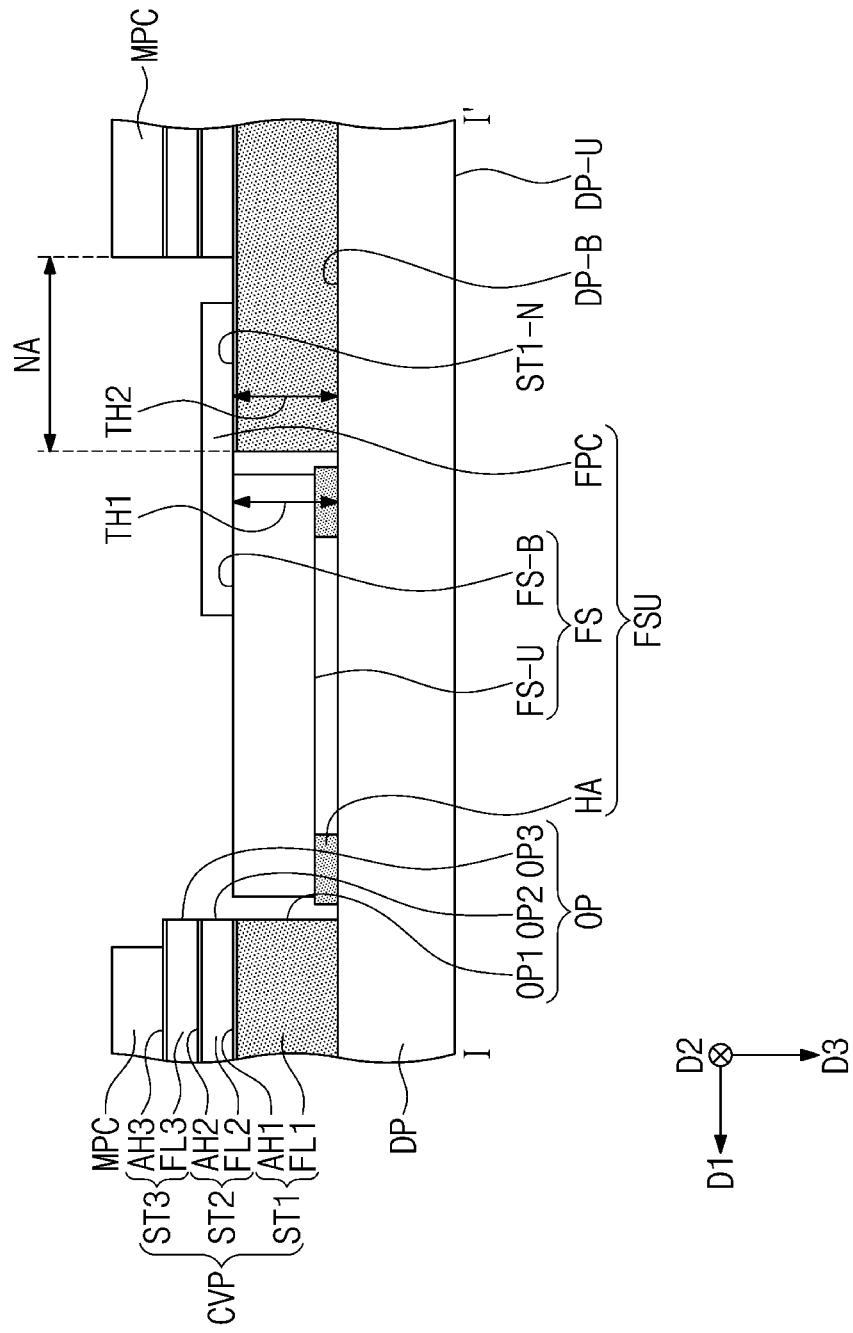
FIG. 5 is a cross-sectional view taken along a line I-I' of FIG. 4 according to an exemplary embodiment of the present inventive concepts.
Figure 6A:
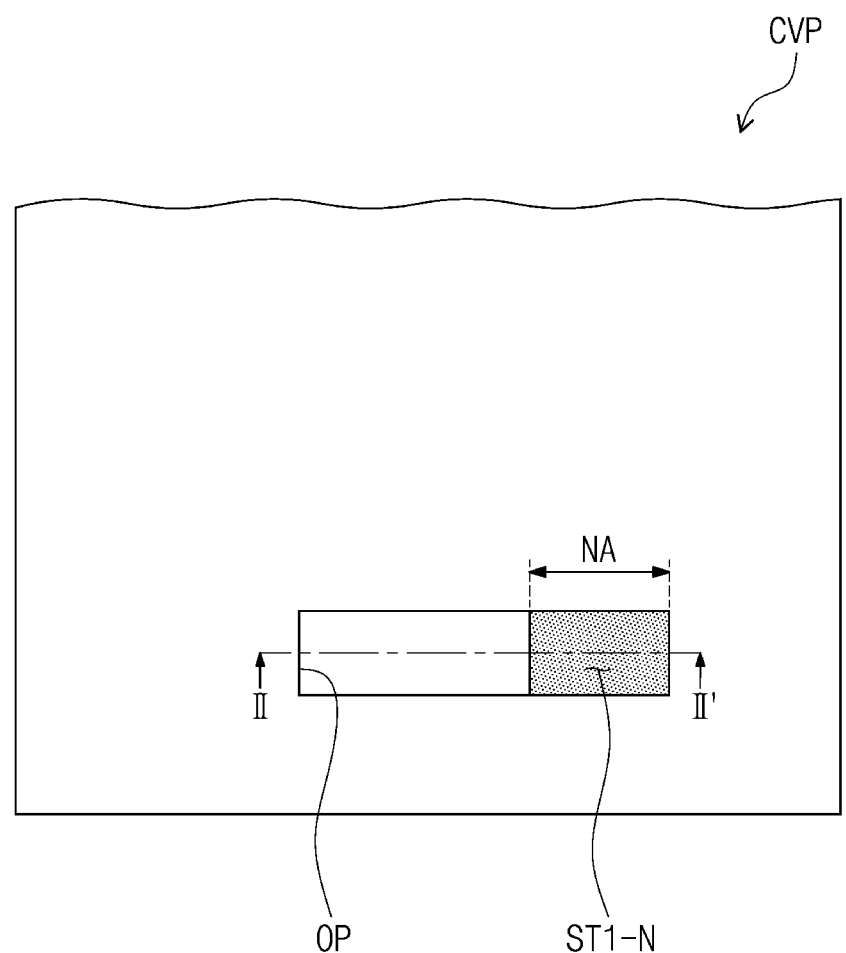
FIG. 6A is a rear elevational view illustrating a lower panel according to an exemplary embodiment of the present inventive concepts.
Figure 6B:
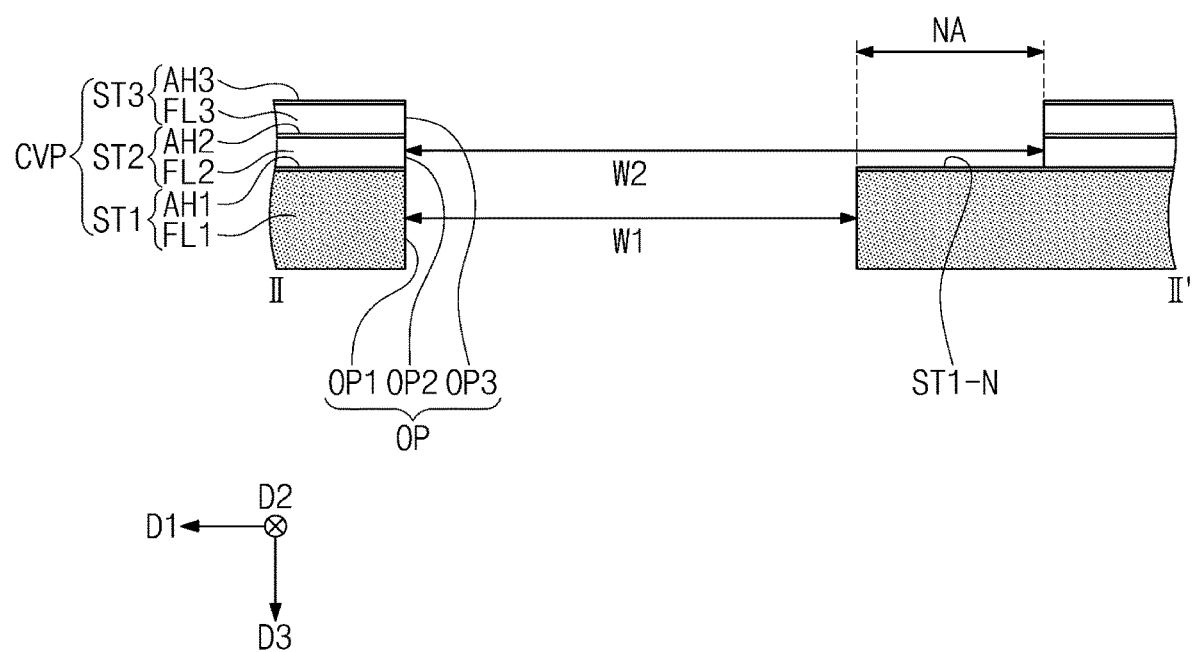
FIG. 6B is a cross-sectional view taken along a line II-II' of FIG. 6, according to an exemplary embodiment of the present inventive concepts.

FIG. 3A is an exploded perspective view illustrating some of the components of FIG. 2. FIG. 3B is a perspective view of some of the components of FIG. 3A. FIG. 4 is a rear elevational view illustrating a portion of a display unit according to an exemplary embodiment of the present inventive concepts. FIG. 5 is a cross-sectional view taken along a line I-I' of FIG. 4. FIG. 6A is a rear elevational view illustrating a lower panel according to an exemplary embodiment of the present inventive concepts. FIG. 6B is a cross-sectional view taken along a line II-II' of FIG. 6A.

FIG. 3A illustrates an exploded perspective view of the display module DD, and FIG. 3B illustrates a perspective view of the display unit DU except the window member WM. Hereinafter, an exemplary embodiment of the present inventive concepts will be described with reference to FIGS. 3A and 3B.

As described above, the window member WM may include the display surface IS including the optically transparent transmission area TA and the bezel area BZA adjacent to the transmission area TA. The window member WM of FIG. 3A may correspond to the window member WM of FIG. 1B, and thus the descriptions to the same features as mentioned above will be omitted.

The display it DU may be disposed on the rear surface of the window member WM. For example, a bottom surface of the window member WM (e.g., in the third direction D3) may contact a top surface (e.g., in the third direction D3) of the display unit DU. The display unit DU may include the display panel DP, a main circuit board MPC, a lower panel CVP, and the fingerprint sensing unit FSU.

The display panel DP may include a front surface DP-U and a rear surface DP-B opposite to the front surface DP-U. The front surface DP-U may face the window member WM (e.g., in the third direction D3). The front surface DP-U may include an active area AA and a peripheral area NAA. In an exemplary embodiment, the display panel DP may include a plurality of layers stacked in the third direction D3, and the rear surface DP-B of the display panel DP may be defined by a layer that is closest to the lower panel CVP, of the stacked layers of the display panel DP.

The display panel DP may activate the active area AA by an electrical signal. The display panel DP may display the image IM in the activated active area AA. In an exemplary embodiment, the transmission area TA may overlap with at least the entire portion of the active area AA.

The peripheral area NAA may be adjacent to the active area AA. The peripheral area NAA may surround at least one edge of the active area AA in a plan view (e.g., when viewed from the third direction D3). For example, as shown in the exemplary embodiment of FIG. 3A, the peripheral area NAA may surround each of the edges of the active area AA in the first direction D1 and/or second direction D2. However, exemplary embodiments of the present inventive concepts are not limited thereto. In another exemplary embodiment, the peripheral area NAA may be adjacent to only a portion of one or more edges of the active area AA.

Various kinds of signal lines and/or electronic elements for providing electrical signals to the active area AA may be disposed in the peripheral area NAA. The peripheral area NAA may be covered by the bezel area BZA and thus may not be visible from the outside.

The display panel DP may include a plurality of signal lines, a pixel PX, and a plurality of display pads PDD. The signal lines may include a gate line GL, a data line DL, and a power line PL. The gate line GL, the data line DL and the power line PL may transmit different electrical signals from each other.

In an exemplary embodiment, the gate line GL may extend in the second direction D2. The gate line GL may be provided in plurality, and the plurality of gate lines GL may be spaced apart from each other and may be arranged in the first direction D1. In FIG. 3A, a single gate line GL is illustrated as an example for the purpose of ease and convenience in description.

In an exemplary embodiment, the display unit DU may further include a gate driving circuit which is mounted on the display panel DP to provide an electrical signal to the gate line GL. In this embodiment, a gate driving circuit pad for providing an electrical signal to the gate driving circuit may be one of the display pads PDD. Alternatively, the display panel DP may further include gate pads electrically connected to a gate driving circuit provided outside of the display panel DP. These gate pads may comprise some of the display pads PDD.

In an exemplary embodiment, the data line DL may extend in the first direction D1. The data line DL may be electrically insulated from the gate line GL. The data line DL may be provided in plurality, and the plurality of data lines DL may be spaced apart from each other and may be arranged in the second direction D2. In FIG. 3A, a single data line DL is illustrated as an example for the purpose of ease and convenience in description. The data line DL may be connected to a data pad corresponding to one of the display pads PDD. The data lure DL may provide a data signal received through the data pad to the pixel PX.

In an exemplary embodiment, the power line PL may extend in the first direction D1. The power line PL may be electrically insulated from the gate line GL and the data line DL. The power line PL may be provided in plurality, and the plurality of power lines PL may be spaced apart from each other and may be arranged in the second direction D2. In FIG. 3A, a single power line PL is illustrated as an example for the purpose of ease and convenience in description. The power line PL may provide a power signal to the pixel PX.

At least some of the components included in the pixel. PX may overlap with the active area AA. The pixel PX may be provided in plurality, and each of the pixels PX may be connected to corresponding signal lines. The pixel PX may display light by an electrical signal to generate the imam IM. In FIG. 3A, a single pixel PX is illustrated as an example for the purpose of ease and convenience in description.

The pixel PX may include a first thin film transistor TR1, a second thin transistor TR2, a capacitor CP, and a light emitting element EMD. The first thin film transistor TR1, the second thin film transistor TR2, the capacitor CP and the light emitting element EMD may be electrically connected to each other.

The first thin film transistor TR1 may be a switching element configured to control the turning on and turning off of the pixel PX. The first thin film transistor TR1 may be connected to the gate line GL and the data line DL. The first thin film transistor TR1 may be turned on by a gate signal provided through the gate line GL and may provide the data signal provided through the data line DL to the capacitor CP when it is turned on.

The capacitor CP may store a voltage corresponding to a potential difference between a first power signal provided from the power line PL and the data signal provided from the first thin film transistor TR1. The second thin film transistor TR2 may provide the first power signal provided from the power line PL to the light emitting element EMD in response to the voltage stored in the capacitor CP.

The light emitting element EMD may be disposed in the active area AA. The light emitting element EMD may generate light or control the amount of light in response to an electrical signal. For example, the light emitting element EMD may include an organic light emitting element, a quantum dot light emitting element, an electrophoretic, element, or an electrowetting element. However, exemplary embodiments of the present inventive concepts are not limited thereto.

The light emitting element EMD may be connected to a power source voltage and may receive a second power signal having a power level that is lower than the power level of the first power signal provided by the power line PL. A driving current corresponding to a difference between the second power signal and the electrical signal provided from the second thin film transistor TR2 may flow through the light emitting element EMD. The light emitting element ENID may generate light corresponding to the driving current.

However, exemplary embodiments of the present inventive concepts are not limited thereto. The components of the pixel PX may be variously modified or changed and may be variously arranged.

The display pads PDD may be disposed in the peripheral area NAA. The display pads PDD may be connected to the signal lines, respectively. For example, as shown in FIG. 3A, the display pads PDD may be disposed on a bottom portion (e.g., in the first direction D1) of the peripheral area NAA and may be connected to the power line PL and data line DL which extend in the first direction. In an exemplary embodiments, the pixels PX may be electrically connected to components, disposed outside of the display panel DP, through the display pads PDD. For example, the display pads PDD may be connected to pads included in the main circuit board MPC.

As shown in the exemplary embodiment of FIG. 4, the main circuit board MPC may include a main flexible film CB-M and a main driving device IC-M. The main circuit board MPC may be connected to the display pads PDD. The main circuit board MPC may provide electrical signals to the display panel DP through the display pads PDD. The main circuit board MPC may generate signals for controlling the image IM and/or power signals and may provide the generated signals to the display panel DP.

In an exemplary embodiment, a portion of the main circuit board MPC may be connected to the front surface DP-U of the display panel DP. Another portion of the main circuit board MPC may be bent to face the rear surface DP-B of the display panel DP. As described above, the main circuit board MPC may include the main flexible film CB-M and the main driving device IG-M.

The main flexible film CB-M may include a main connector CB-MC, pads, and signal lines. The main flexible film CB-M may be connected to the display pads PDD through the pads and thus may be electrically connected to the display panel DP. The main flexible film CB-M may be electrically and physically coupled to the display panel DP through an adhesive member, such as an anisotropic conductive film, etc. The main connector CB-MC may be bent toward the display panel DP and may be electrically connected to the electronic module EM.

The main driving device IC-M may be mounted on the main flexible film CB-M. The main driving device IC-M may be connected to the signal lines of the main flexible film CB-M and thus may be electrically connected to the display panel D2. The main driving device IC-M may generate and/or process various kinds of electrical signals.

The lower panel CVP may be disposed on the rear surface DP-B of the display panel DP. The lower panel CVP may include a plurality of sheets ST1, ST2 and ST3 which may extend in the first direction D1 and second direction D2. The lower panel CVP may include an opening OP in which the fingerprint sensing unit FSU is positioned (e.g., mounted). The sheets ST1, ST2 and ST3 may be sequentially stacked in the third direction D3.

The sheets ST1, ST2 and ST3 may include openings OP1, OP2 and OP3, respectively, and the opening OP, of the lower panel CVP (e.g., a main opening) may be defined by the openings OP1, OP2 and OP3 of the sheets ST1, ST2 and ST3, which overlap with each other in the third direction D3. In the exemplary embodiment shown in FIG. 3A, the openings OP1, OP2 and OP3 comprise rectangular openings that extend in the first direction D1 and second direction D2. However, exemplary embodiments of the present inventive concepts are not limited thereto and the openings may have numerous different shapes and sizes. Furthermore, while the exemplary embodiments show the plurality of sheets including three sheets, in other exemplary embodiments, there may only be two sheets or there may be four or more sheets.

A first sheet ST1 may be closest to the rear surface DP-B of the display panel DP (e.g., in the third direction D3). In an exemplary embodiment, a bottom surface of the display panel (e.g., in the third direction D3) may directly contact a top surface of the first sheet ST1 (e.g., in the third direction D3). As shown in the exemplary embodiment of FIG. 5, the first sheet ST1 may include a first functional layer FL1 having a cushion function and a first adhesive layer AH1 disposed on the first functional layer FL1. For example, as shown in the exemplary embodiment of FIG. 5, the first adhesive layer AH1 may be disposed on a bottom surface (e.g., in the third direction D3) of the first functional layer FL1. The first sheet ST1 may include a first opening OP penetrating a portion of the first sheet ST1 along the third direction D3. The first opening OP1 may overlap with the fingerprint sensing unit FSU in the third direction D3.

In an exemplary embodiment, the first functional layer FL1 may include a synthetic resin foam including a matrix member and a plurality of pores. The matrix member may include a flexible material. For example, the matrix member may include a synthetic resin. The pores may easily absorb an impact applied to the display panel DP. The first sheet ST1 may have a porous structure and pores may be dispersed throughout the matrix member. The pores may allow a shape of the first sheet ST1 to be easily deformed. Therefore, elasticity of the first sheet ST1 may be improved to increase an impact resistance of the lower panel CVP.

The first adhesive layer may couple the first functional layer FL1 to the second sheet ST2 (e.g., a second functional layer FL2 of the second sheet). The first adhesive layer AH1 may be optically transparent or clear. For example, in an exemplary embodiment, the first adhesive layer AH1 may include at least one of an optical clear resin (OCR), an optical clear adhesive (OCA), or a pressure sensitive adhesive (PSA). Alternatively, the first adhesive layer AH1 may be a double-sided tape. However, exemplary embodiments of the present inventive concepts are not limited to a specific embodiment.

The second sheet ST2 may be disposed between the first sheet ST1 and a third sheet ST3 (e.g., in the third direction D3). The second sheet ST2 may include a second functional layer FL2 having a heat dissipation function and a second adhesive layer AH2 disposed on the second functional layer FL2. For example, the second adhesive layer AH2 may be disposed on a bottom surface (e.g., in the third direction D3) of the second functional layer FL2. The second sheet ST2 may include a second opening OP2 which penetrates a portion of the second sheet ST2 along the third direction D3. The second opening OP2 may overlap with the fingerprint sensing unit FSU in the third direction D3.

In a exemplary embodiment, the second functional layer FL2 may be a sheet including a metal material having high thermal conductivity, such as copper or aluminum. The metal having a high thermal conductivity may absorb heat in order to provide the heat dissipation function.

The second adhesive layer AH2 may couple the second functional layer FL2 to the third sheet ST3. The second adhesive layer AH2 may be optically transparent or clear. For example, the second adhesive layer AH2 may include the same resin, or adhesive as the first adhesive layer AH1 or may include a double-sided tape. However, exemplary embodiments of the present inventive concepts are not limited thereto.

The third sheet ST3 may be disposed on the second sheet ST2. For example, a top surface (e.g., in the third direction D3) of the third sheet ST3 may be disposed on a bottom surface (e.g., in the third direction D3) of the second sheet ST2. As shown in FIG. 5, the third sheet ST3 may include a third functional layer FL3 having a light blocking function and a third adhesive layer AH3 disposed on the third functional layer FL3. For example, the third adhesive layer AH3 may be disposed on a top surface (e.g., in the third direction D3) of the third functional layer FL3. The third sheet ST3 may include a third opening OP3 penetrating a portion of the third sheet ST3 along the third direction D3. The third opening OP3 may overlap with the fingerprint sensing unit FSU in the third direction D3.

The third functional layer FL3 may prevent components, disposed on the rear surface DP-B of the display panel DP, from being visible to the outside. However, exemplary embodiments of the present inventive concepts are not limited thereto. In another exemplary embodiment, the third sheet ST3 may be a light blocking layer formed directly on the rear surface DP-B of the display panel DP. In this embodiment, the third sheet ST3 may be formed by coating the rear surface DP-B of the display panel DP with a material such as carbon and/or chromium, and a separate adhesive layer may be omitted.

The third adhesive layer AH3 may couple the third functional layer FL3 to the main circuit board MPC. The third adhesive layer AH3 may be optically transparent or clear. For example, the third adhesive layer AH3 may include the same resin or adhesive as the first adhesive layer AH1 or may include a double-sided tape. However, exemplary embodiments of the present inventive concepts are not limited thereto.

According to the exemplary embodiments of the present inventive concepts, the opening OP of the lower panel CVP may be defined by the overlapping portions of the openings OP1, OP2 and OP3 of the sheets ST1, ST2 and ST3 (e.g., in the third direction D3). In an exemplary embodiment, an area of at least one of the openings OP1, OP2 and OP3 may be different from the area of at least one of the other openings. For example, as shown in FIG. 5, the area of the first opening OP1 of the first sheet ST1 may be less than the areas of the second and third openings OP2 and OP3 of the second and third sheets ST2 and ST3. For example, the opening OP1 of the first sheet shown in the exemplary embodiment of FIG. 5 may have a smaller length in the first direction D1 and/or the second direction D2 than the openings O2 and O3 of the second sheet ST2 and third sheet ST3. Therefore, a portion of the first sheet ST1 may be exposed by the second and third openings OP2 and OP3 when viewed from a rear surface of the lower panel CVP (e.g., in the third direction D3).

As illustrated in FIGS. 4 and 5, the fingerprint sensing unit FSU may be disposed on the rear surface DP-B of the display panel DP. The fingerprint sensing unit FSU may include a fingerprint sensor FS, an adhesive portion HA, and a sensing circuit board FPC. The sensing circuit board FPC may be electrically connected to the fingerprint sensor FS.

The fingerprint sensor FS may include at least one sensor. In embodiments in which the fingerprint sensor FS includes a plurality of sensors, one or more of the sensors may be driven by various different methods. For example, the fingerprint sensor FS may include an optical fingerprint sensor for sensing incident light by using a light sensor, an ultrasonic fingerprint sensor for sensing vibration by using a piezoelectric material, etc. However, exemplary embodiments of the present inventive concepts are not limited thereto.

In an exemplary embodiment, the opening OP defined in the lower panel CVP may be configured to receive the fingerprint sensor FS. For example, the fingerprint sensor FS may be received in the opening OP of the lower panel CVP and may be disposed on the rear surface DP-B of the display panel DP in the opening OP.

In FIG. 3B, an area in which the fingerprint sensor FS is disposed (e.g., on a rear side of the display panel DP) is illustrated by a dotted line for the purpose of ease and convenience in description and illustration. In the present exemplary embodiment, the fingerprint sensor FS may overlap with the active area AA (e.g., in the third direction D3). In an exemplary embodiment, the fingerprint sensor FS received in the opening OP may be spaced apart from a sidewall of the opening OP, and a space GP may be defined between the fingerprint sensor FS and the sidewall of the opening OP (e.g., in the first direction D1 and/or second direction D2).

The adhesive portion HA may couple the fingerprint sensor FS to the rear surface DP-B of the display panel DP. In an exemplary embodiment, the adhesive portion HA may have a closed-line shape surrounding the fingerprint sense FS received in the opening OP when viewed in a plan view. For example, in the exemplary embodiment shown in FIG. 4, the adhesive portion HA may have a general rectangular shape extending in the first direction D1 and second direction D2 which surrounds the fingerprint sensor FS. However, exemplary embodiments of the present inventive concepts are not limited thereto. The adhesive portion HA may partially overlap with the space GP but may be spaced apart from the sidewall of the opening OP by a predetermined distance. Therefore, interference between the lower panel CVP and the adhesive portion HA may be minimized.

The adhesive portion HA may be optically transparent or clear. For example, the adhesive portion HA may include at least one of an optical clear resin (OCR), an optical clear adhesive (OCA), or a pressure sensitive adhesive (PSA). In this embodiment, even though the fingerprint sensor FS operates by the optical method, it is possible to inhibit or prevent the amount of light provided to the fingerprint sensor FS from being reduced by the adhesive portion HA. Therefore, the adhesive portion HA may stably couple the fingerprint sensor FS to the display panel DP regardless of the operating method of the fingerprint sensor FS.

In an exemplary embodiment, the sensing circuit board FPC may be electrically connected to the main circuit board MPC and is bent toward the rear surface DP-B of the display panel DP. The sensing circuit board FPC may include a sensing circuit film CB-F and a sensing driving device IC-F.

The sensing circuit film CB-F may include a sensing connector CB-FC and signal lines. The sensing circuit film CB-F may be connected to the fingerprint sensor FS through an adhesive member, such as an anisotropic conductive film, etc. Alternatively, the sensing circuit film CB-F may be coupled to the fingerprint sensor FS through a connector. The sensing connector CB-FC may be electrically connected to the main circuit board MPC.

The sensing driving device IC-F may be mounted on the sensing circuit film CB-F. The sensing driving device IC-F may be connected to the signal lines of the sensing circuit film CB-F and thus may be electrically connected to the fingerprint sensor FS. The sensing driving device IC-F may receive an electrical signal, generated by a user's fingerprint FNG (see FIG. 1A), from the fingerprint sensor FS and may process the received electrical signal.

According to an exemplary embodiment of the present inventive concepts, a portion of the first sheet ST1 that is in contact with the rear surface DP-B of the display panel DP may be exposed from the second and third sheets ST2 and ST3 and may be in contact with a portion of the sensing circuit board FPC.

As illustrated in FIGS. 6A and 6B, in the present exemplary embodiment, the area of the first opening OP1 of the first sheet ST1 may be less than the areas of the second and third openings OP2 and OP3 of the second and third sheets ST2 and ST3. For example, the length of the first opening the first direction D1 and/or second direction D2 may be less than the corresponding lengths in the second and third openings OP2, OP3.

For example, the first opening OP1 may have a first width W1 in the first direction D1, and each of the second and third openings OP2 and OP3 may have a second width W2 in the first direction D1. In the exemplary embodiment shown in FIG. 6B, the first width W1 is less than the second width W2. In addition, the area of the first opening OP1 may be less than the areas of the second and third openings OP2 and OP3 in a plan view (e.g., when viewed from the third direction D3).

Since the area of the first opening OP1 is less than the areas of the second, and third openings OP2 and OP3, a portion of the first sheet ST1 may be exposed through the second and third openings OP2 and OP3.

For example, a surface of the first sheet ST1, which faces the rear surface DP-B of the display panel DP may be defined as a front surface of the first sheet ST1. Another surface of the first sheet ST1, which is opposite to the front surface of the first sheet ST1, may be defined as a rear surface of the first sheet ST1. A portion of the rear surface of the first sheet ST1 may be exposed through the second and third openings OP2 and OP3.

According to an exemplary embodiment of the present inventive concepts, the portion ST1-N of the rear surface of the first sheet ST1, which is exposed through the second and third openings OP2 and OP3, may be in contact with a portion of the sensing circuit board FPC. The portion ST1-N of the rear surface of the first sheet ST1, which is exposed through the second and third openings OP2 and OP3, may be defined as an exposed area NA.

In an exemplary embodiment, the sensing circuit board FPC may be connected to the fingerprint sensor FS and may extend onto the exposed area NA in the first direction D1.

The sensing circuit board FPC extending on the exposed area NA may be in contact with the portion ST1-N of the rear surface of the first sheet ST1 The first adhesive layer AH1 may be exposed at the portion ST1-N of the rear surface of the first sheet ST1. Therefore, the sensing circuit board FPC extending on the exposed area NA may be stably coupled to the first sheet ST1 by the first adhesive layer AH1.

Referring to FIG. 5, in the present exemplary embodiment, the fingerprint sensing unit FSU may have a first thickness TH1. The first thickness TH1 may be defined as a sum of a thickness of the fingerprint sensor FS and a thickness of the adhesive portion HA in the third direction D3.

The first sheet ST1 of the lower panel CVP may have a second thickness TH2. The second thickness TH2 may be defined as a sum of a thickness of the first functional layer FL1 and a thickness of the first adhesive layer AH1 in the third direction D3.

In the present exemplary embodiment, the first thickness TH1 may be equal to the second thickness TH2. Therefore, a height (e.g., distance in the third direction D3) from the rear surface DP-B of the display panel DP to the sensing circuit board FPC overlapping with the fingerprint sensor FS (e.g., in the third direction D3) may be equal to a height from the rear surface DP-B of the display panel DP to the sensing circuit board FPC overlapping with the exposed area NA. Thus, the sensing circuit board FPC may be stably disposed on the fingerprint sensor FS and the portion ST1-N of the rear surface of the first sheet ST1.

According to the exemplary embodiments of the present inventive concepts, the lower panel CVP may include the sheets ST1, ST2 and ST3 having the openings OP1, OP2 and OP3 of different areas, and the sensing circuit board FPC may be disposed on the portion ST1-N of the rear surface of the first sheet ST1, which has the same height as the fingerprint sensor FS. Therefore, it is possible to minimize stress which may occur at the sensing circuit board FPC by a height difference between the fingerprint sensor FS and the sheets ST1, ST2 and ST3.

As a result, the adhesive strength between the sensing circuit board FPC and the fingerprint sensor FS may be increased, and coupling strength between the fingerprint sensor FS and the rear surface DP-B of the display panel DP may also be increased. Therefore, a fingerprint sensing function of the electronic apparatus ED (see FIG. 1A) may be improved.

Figure 7:
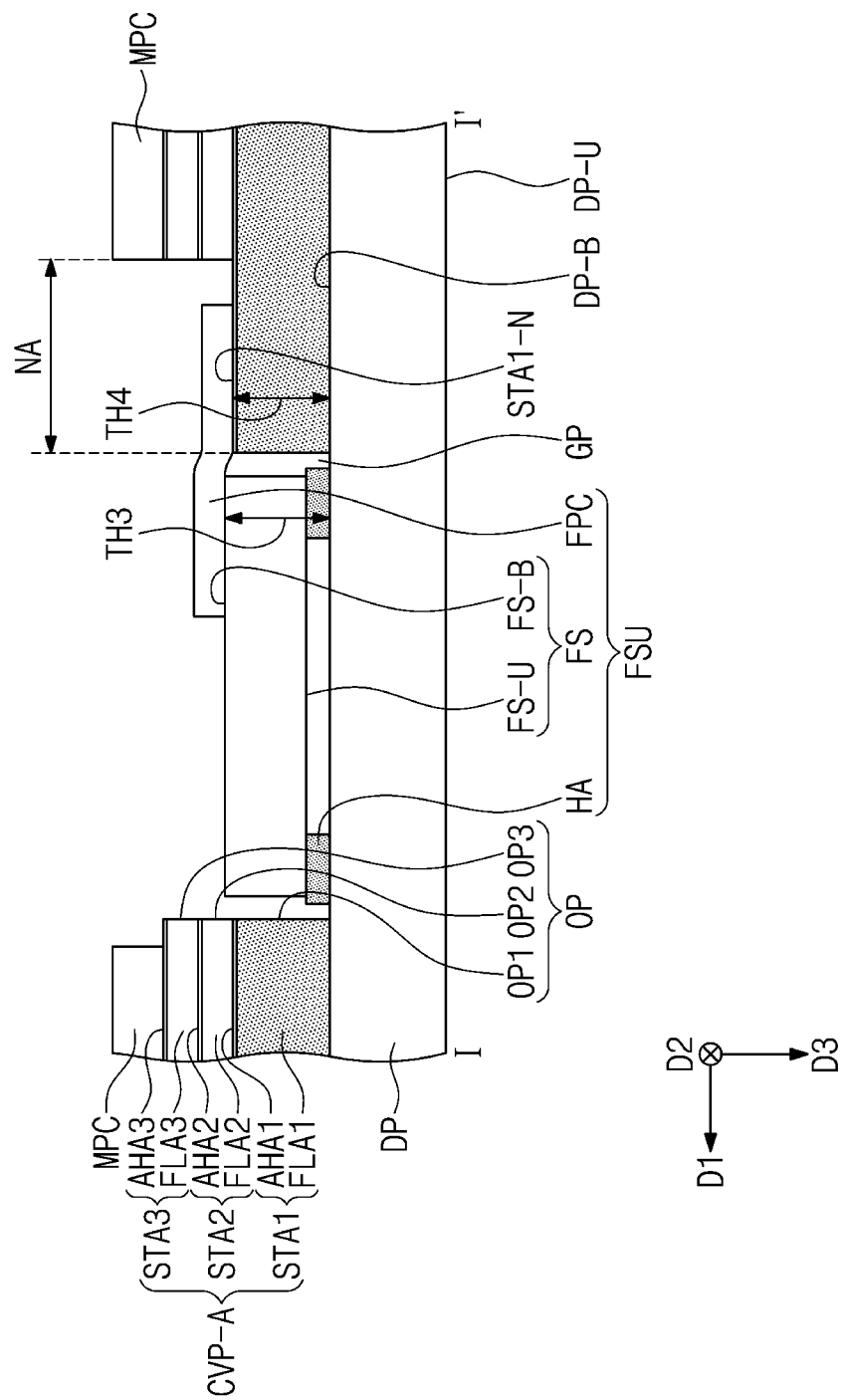
FIG. 7 is a cross-sectional view illustrating a portion of a display unit according to an exemplary embodiment of the present inventive concepts.

FIG. 7 is a cross-sectional view illustrating a portion of a display unit according to an exemplary embodiment of the present inventive concepts. In the present exemplary embodiment, the same/similar components as in the exemplary embodiments of FIGS. 1A to 6B will be indicated by the same/similar reference designators, and the descriptions to the same components and features as in the exemplary embodiments of FIGS. 1A to 6B will be omitted.

Referring to FIG. 7, in the present exemplary embodiment, a lower panel. CVP-A may include a first sheet STA1 including a first functional layer FLA1 and a first adhesive layer AHA1, a second sheet STA2 including a second functional layer FLA2 and a second adhesive layer AHA2, and a third sheet STA3 including a third functional layer FLA3 and a third adhesive layer AHA3.

In the exemplary embodiment of FIG. 7, the fingerprint sensing unit FSU may have a third thickness TH3. The third thickness TH3 may be defined as a sum of a thickness of the fingerprint sensor FS and a thickness of the adhesive portion HA in the third direction D3.

The first sheet STA1 of the lower panel CVP-A may have a fourth thickness TH4. The fourth thickness TH4 may be defined as a sum of a thickness of the first functional layer FLA1 and a thickness of the first adhesive layer AHA1 in the third direction D3.

In the present exemplary embodiment, the fourth thickness TH4 may be less than the third thickness TH3. Therefore, a height (e.g., distance in the third direction D3) from the rear surface DP-B of the display panel DP to the sensing circuit board FPC overlapping with the fingerprint sensor FS may be greater than a height (e.g., distance in the third direction D3) from the rear surface DP-B of the display panel DP to the sensing circuit board FPC overlapping with the exposed area NA. Thus, the sensing circuit board FPC may be bent in a direction from the fingerprint sensor FS toward the exposed area NA. For example, a portion of the sensing circuit board FPC, which overlaps with the space GP in the third direction D3 (see FIG. 4), may be bent. The bent portion may bend towards the display panel DP (in the third direction D3) from the fingerprint sensor FS to the exposed area of the first sheet STA1.

According to exemplary embodiments of the present inventive concepts, the lower panel CVP-A may include the sheets STA1, STA2 and STA3 having the openings OP1, OP2 and OP3 of different areas, and the sensing circuit board FPC may be disposed on an exposed portion STA1-N of a rear surface of the first sheet STA1, which has a lower height than the fingerprint sensor FS. Therefore, it is possible to minimize guess which may occur at the sensing circuit board FPC by a height difference between the fingerprint sensor FS and the sheets STA1, STA2 and STA3.

As a result, adhesive strength between the sensing circuit board FPC and the fingerprint sensor FS may be increased, and coupling strength between the fingerprint sensor FS and the rear surface DP-B of the display panel DP may also be increased. Thus, the fingerprint sensing function of the electronic apparatus ED (see FIG. 1A) may be improved.

Figure 8:
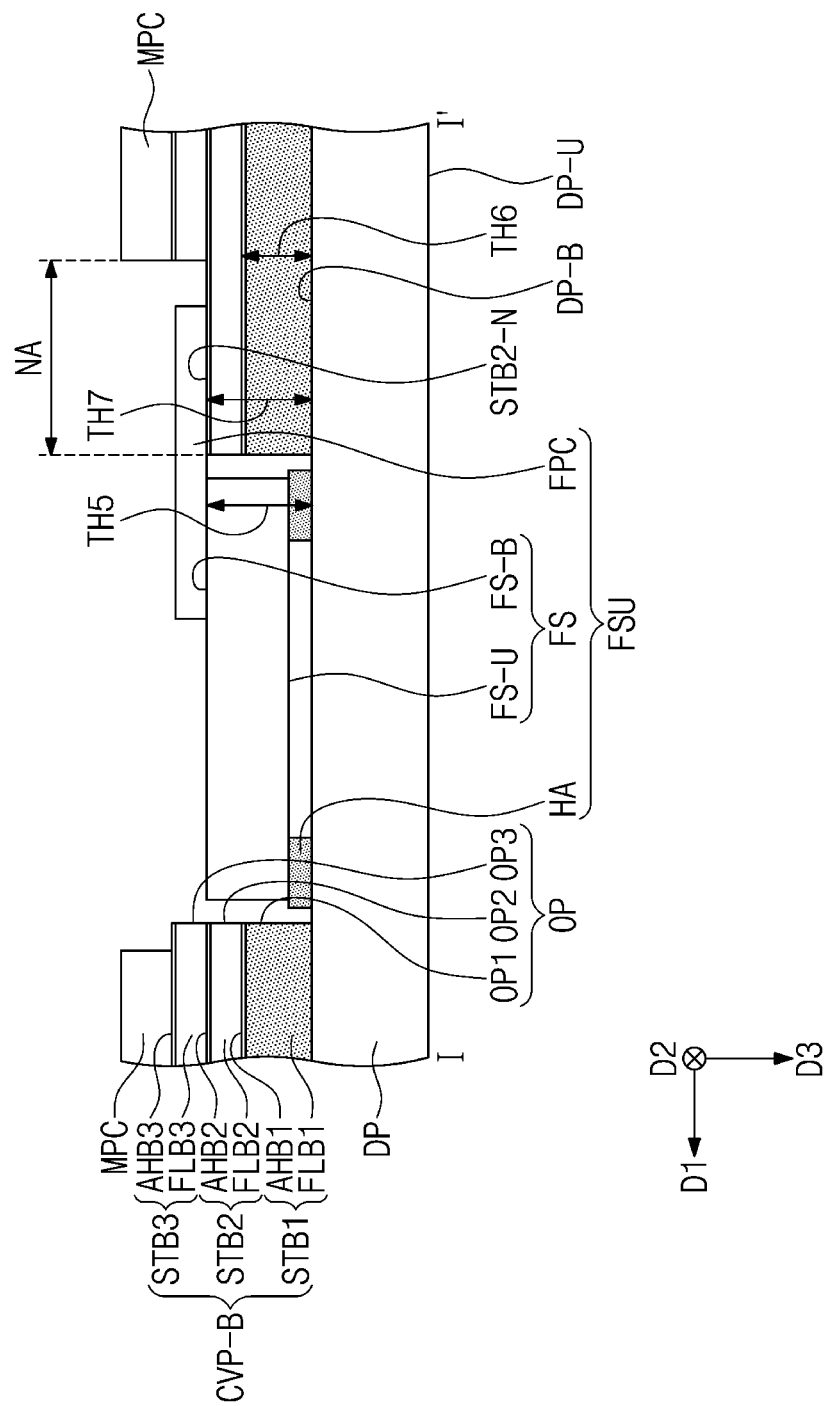
FIG. 8 is a cross-sectional view illustrating a portion of a display unit according to an exemplary embodiment of the present inventive concepts.

FIG. 8 is a cross-sectional view illustrating a portion of a display unit according to an exemplary embodiment of the inventive concepts. In the exemplary embodiment shown in FIG. 8, the same/similar components as in the exemplary embodiments of FIGS. 1A to 6B will be indicated by the same/similar reference designators, and the descriptions to the same components and features as in the exemplary embodiments of FIGS. 1A to 6B will be omitted.

Referring to FIG. 8, in the present exemplary embodiment, a lower panel CVP-B may include a first sheet STB1 including a first functional layer FLB1 and a first adhesive layer a second sheet STB2 including a second functional layer FLB2 and a second adhesive layer AHB2, and a third sheet STB3 including a third functional layer FLB3 and a third adhesive layer AHB3.

The lower panel CVP-B may include the sheets STB1, STB2 and STB3 having openings OP1, OP2 and OP3 of different areas.

For example, in an exemplary embodiment, the areas of the first and second openings OP1 and OP2 (e.g., length of the sides in the first direction D1 and/or second direction D2) may be equal to each other, and the area of the third opening OP3 may be greater than the areas of the first and second openings OP1 and OP2. For example, as shown in the exemplary embodiment of FIG. 8, the width of the third opening OP3 in the first direction D1 may be greater than the corresponding width of the first opening OP1 and the second opening OP2.

In the exemplary embodiment of FIG. 8, a portion STB-N of a rear surface of the second sheet STB2, which is exposed through the third opening OP3, may be in contact with a portion of the sensing circuit board FPC. The portion STB2-N of the rear surface of the second sheet STB2, which is exposed through the third opening OP3, may be defined as an exposed area NA.

In the present exemplary embodiment, the fingerprint sensing unit FSU, may have a fifth thickness TH5. The fifth thickness TH5 may be defined as a sum of a thickness of the fingerprint sensor FS and a thickness of the adhesive portion HA in the third direction D3.

The first sheet STB1 of the lower panel CVP-B may have a sixth thickness TH6. The sixth thickness TH6 may be defined as a stun of a thickness of the first functional layer FLB1 and a thickness of the first adhesive layer AHB1 in the third direction D3.

A sum of thicknesses of the first and second sheets STB1 and STB2 of the lower panel CVP-B may be a seventh thickness TH7. The seventh thickness TH7 may be defined as a sum of the thickness of the first functional layer, a thickness of the second functional layer FLB2, the thickness of the first adhesive layer AHB1 and a thickness of the second adhesive layer AHB2 in the third direction D3.

In the exemplary embodiment shown in FIG. 8, the sixth thickness TH6 may be less than the fifth thickness TH5, and the seventh thickness TH7 may be equal to the fifth thickness TH5. Therefore, a height from the rear surface DP-B of the display panel DP to the sensing circuit board FPC overlapping with the fingerprint sensor FS may be equal to a height from the rear surface DP-B of the display panel DP to the sensing circuit board FPC overlapping with the exposed area NA. Accordingly, the sensing circuit board ITC may be stably disposed on the fingerprint sensor FS and the portion STB2-N of the rear surface of the second sheet STB2. However, in another exemplary embodiment, the thickness TH5 of the fingerprint sensing unit may be greater than the thickness TH7 of the sum of thicknesses of the first and second sheets STB1 and STB2 of the lower panel CVP-B. Therefore, a height from the rear surface DP-B of the display panel DP to the sensing circuit board FPC may be bent in a direction from the fingerprint sensor FS toward the exposed area NA.

Figure 9:
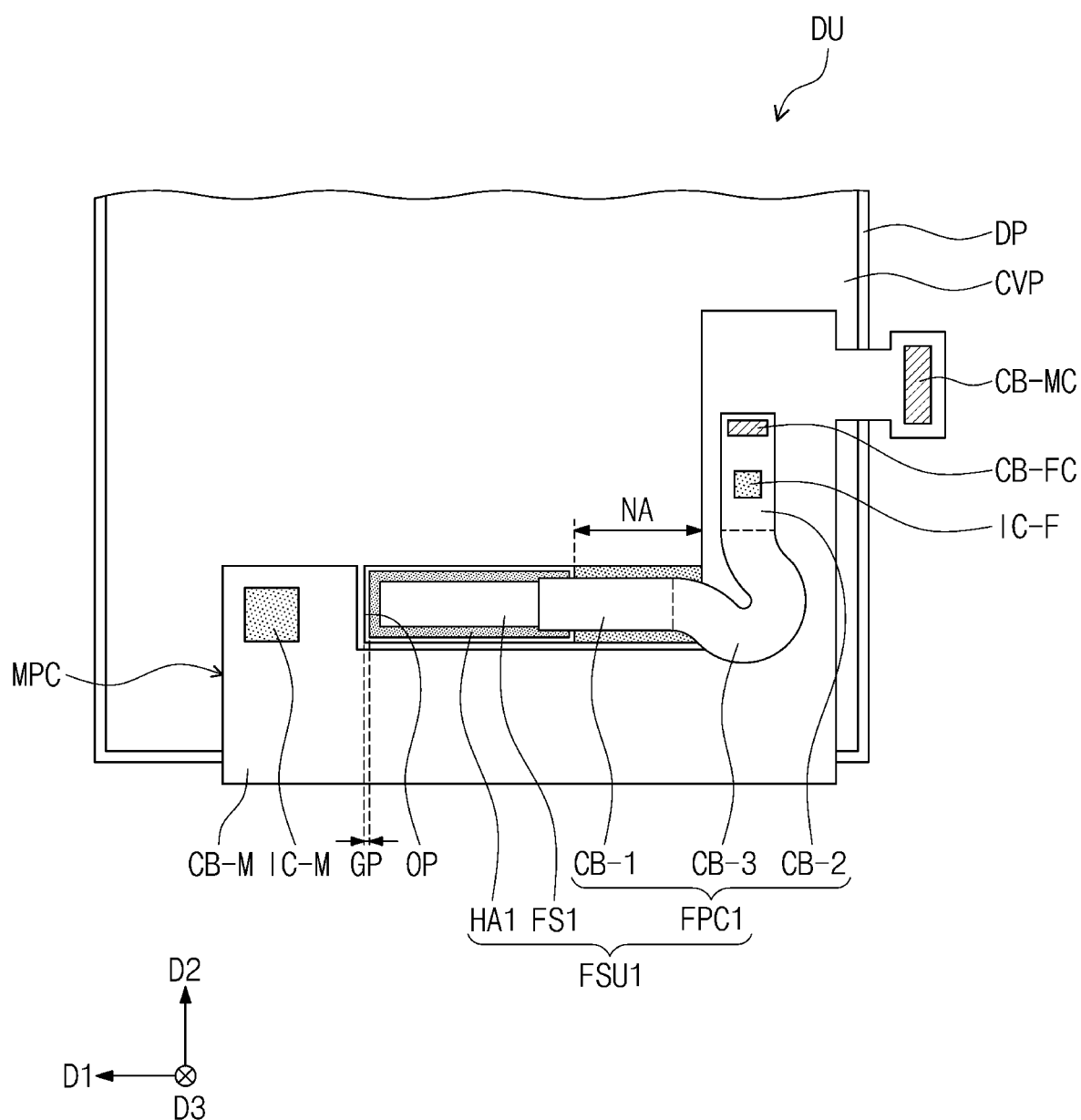
FIG. 9 is a rear elevational view illustrating a display unit according to an exemplary embodiment of the present inventive concepts.

FIG. 9 is a rear elevational view illustrating a display unit according to an exemplary embodiment of the present inventive concepts. In the present exemplary embodiment, the same/similar components as in the exemplary embodiments of FIGS. 1A to 6B will be indicated by the same/similar reference designators, and the descriptions to the same components and features as in the exemplary embodiments of FIGS. 1A to 6B will be omitted.

A fingerprint sensing unit FSU1 according to the exemplary embodiment of FIG. 9 may include a fingerprint sensor FS1, an adhesive portion HAI, and a sensing circuit board FPC1.

In the exemplary embodiment of FIG. 9, the sensing circuit board FPC1 may include a first connection portion CB-1, a second connection portion CB-2, and a grip portion CB-3.

The first connection portion CB-1 may be connected to the fingerprint sensor FS1 and may extend, onto the exposed area NA in the first direction D1. The first connection portion CB-1 may overlap with the exposed area NA (e.g., in the third direction D3). The second connection portion CB-2 may be disposed on the main circuit board MPC. The grip portion CB-3 may be disposed between the first connection portion CB-1 and the second connection portion CB-2 (e.g., in the first direction D1 and/or second direction D2).

The grip portion CB-3 may be a portion grasped by a user in a process of coupling the sensing circuit board FPC1 to the fingerprint sensor FS1 or the main circuit board MPC.

Since the first connection portion CB-1 overlaps with the exposed area NA, the first connection portion CB-1 may not be affected by a height difference between the lower panel CVP and the main circuit board MPC. Therefore, the first connection portion CB-1 may be stably coupled to the exposed area NA, and coupling strength between the first connection portion CB-1 and the fingerprint sensor FS may be increased. Accordingly, the reliability of the electronic apparatus ED may be improved.

According to the exemplary embodiments of the present inventive concepts, the lower panel receiving the fingerprint sensing unit may include the sheets having the openings of different areas, and the sensing circuit board of the fingerprint sensing unit may be disposed on the rear surface of the sheet, which has the same height as or a lower height than the fingerprint sensor. Thus, it is possible to minimize stress which may occur at the sensing circuit board by a height difference between the fingerprint sensor and the sheets.

As a result, the adhesive strength between the sensing circuit board and the fingerprint sensor may be increased, and the coupling strength between the fingerprint sensor and the display panel may also be increased. Therefore, the reliability of the electronic apparatus may be improved.

While the present inventive concepts have been described with reference to exemplary embodiments, it will be apparent to those skilled in the art that various changes and modifications may be made without departing from the spirits and scopes of the inventive concepts. Therefore, it should be understood that the above exemplary embodiments are not limiting, but illustrative. Thus, the scope of the present inventive concepts are to be determined by the broadest permissible interpretation of the following claims and their equivalents, and shall not be restricted or limited by the foregoing description.

What is claimed is:
1. An electronic apparatus comprising:
a display panel including a front surface and a rear surface opposite to the front surface;

a lower panel including a plurality of sheets stacked on the rear surface of the display panel and an opening penetrating the sheets, wherein the opening exposes a portion of a rear surface of a first sheet that has a front surface opposite to the exposed portion of the rear surface that contacts the display panel; and a fingerprint sensing unit including a fingerprint sensor positioned in the opening and a sensing circuit board connected to the fingerprint sensor, wherein the exposed portion of the rear surface of the first sheet contacts a portion of the sensing circuit board.

2. The electronic apparatus of claim 1, wherein the plurality of sheets of the lower panel comprise:

the first sheet including a first functional layer having a cushioning function and a first adhesive layer disposed on the first functional layer;

a second sheet including a second functional layer disposed on the first adhesive layer having a heat dissipation function and a second adhesive layer disposed on the second functional layer; and a third sheet including a third functional layer disposed on the second adhesive layer having a light blocking function and a third adhesive layer disposed on the third functional layer.

3. The electronic apparatus of claim 2, wherein the opening comprises:

a first opening in the first sheet;

a second opening in the second sheet;

and a third opening in the third sheet, wherein an area of the second opening and the third opening is greater than an area of the first opening.

4. The electronic apparatus of claim 3, wherein a thickness of die lower panel overlapping with the exposed area is equal to or less than a thickness of the fingerprint sensing unit.

5. The electronic apparatus of claim 4, wherein a distance from the rear surface of the display panel to the sensing circuit board overlapping with the fingerprint sensor is equal to a distance from the rear surface of the display panel to the sensing circuit board overlapping with the exposed area.

6. The electronic apparatus of claim 4, wherein a distance from the rear surface of the display panel to the sensing circuit board overlapping with the fingerprint sensor is greater than a distance from the rear surface of the display panel to the sensing circuit board overlapping with the exposed area.

7. The electronic apparatus of claim 4, wherein the sensing circuit board is bent in a direction from the fingerprint sensor toward the exposed area.

8. The electronic apparatus of claim 2, wherein the first adhesive layer is configured to couple the exposed portion of the rear surface of the first sheet to the sensing circuit board.

9. The electronic, apparatus of claim 1, further comprising:

a main circuit board connected to the front surface of the display panel and bent toward the rear surface of the display panel, wherein the sensing circuit board is connected to the main circuit board.

10. The electronic apparatus of claim 9, wherein the sensing circuit board includes:

a first connection portion connected to the fingerprint sensor;

a second connection portion connected to the main circuit hoard; and a grip portion disposed between the first connection portion and the second connection portion, wherein the grip portion has a predetermined curvature.

11. The electronic apparatus of claim 1, wherein the fingerprint sensing unit further comprises an adhesive portion configured to couple the fingerprint sensor to the rear surface of the display panel.

12. The electronic apparatus of claim 11, wherein the opening is spaced apart from the adhesive portion and the opening has a closed-line shape surrounding an edge of the fingerprint sensor.

13. An electronic apparatus comprising:

a display panel including a front surface and a rear surface opposite to the front surface;

a fingerprint sensing unit including a fingerprint sensor disposed on the rear surface of the display panel and a sensing circuit hoard connected to the fingerprint sensor; and a lower panel disposed on the rear surface of the display panel and including an exposed area overlapping with the sensing circuit board, wherein the fingerprint sensor is positioned within an opening in the lower panel, wherein a thickness of the lower panel in the exposed area is equal to or less than a thickness of the fingerprint sensing unit.

14. The electronic apparatus of claim 13, wherein the lower panel comprises:

a first sheet including a first functional layer having a cushioning function and a first adhesive layer disposed on the first functional layer;

a second sheet including a second functional layer disposed on the first adhesive layer having a heat dissipation function and a second adhesive layer disposed on the second functional layer; and a third sheet including a third functional layer disposed on the second adhesive layer having a light blocking function and a third adhesive layer disposed on the third functional layer.

15. The electronic apparatus of claim 14, wherein the exposed area comprises a rear portion of the first sheet; and portions of the second and third sheets are removed thereby exposing portions of the first adhesive layer on the rear portion of the first sheet.

16. The electronic apparatus of claim 15, wherein the first adhesive layer of the first sheet is configured to couple the first sheet to a portion of the sensing circuit hoard overlapping with the exposed area.

17. The electronic apparatus of claim 15, wherein a distance from the rear surface of die display panel to the sensing circuit board overlapping with the fingerprint sensor is equal to a distance from the rear surface of the display panel to the sensing circuit board overlapping with the exposed area.

18. The electronic apparatus of claim 15, wherein a distance from the rear surface of the display panel to the sensing circuit hoard overlapping with the fingerprint sensor is greater than a distance from the rear surface of the display panel to the sensing circuit board overlapping with the exposed area.

19. The electronic apparatus of claim 18, wherein the sensing circuit board is bent in a direction from the fingerprint sensor toward the exposed area.

20. The electronic apparatus of claim 15, wherein the fingerprint sensing unit further comprises an adhesive portion configured to couple the fingerprint sensor to the rear surface of the display panel, wherein the adhesive portion is disposed along an edge of the fingerprint sensor.

21. An electronic apparatus comprising:
a display panel including a front surface and a rear surface opposite to the front surface;
a lower panel includes a plurality of sheets stacked on the rear surface of the display pane, the plurality of sheets including a first sheet having a first opening, a second sheet having a second opening and a third sheet having a third opening, wherein the first opening, the second opening and the third opening form a main opening;
a fingerprint sensing unit including a fingerprint sensor positioned in the main opening and a sensing circuit board connected to the fingerprint sensor,
wherein the first opening and the second opening have a smaller area than the third opening and the third opening exposes a portion of a rear surface of the second sheet; and
the sensing circuit board is coupled to the exposed portion of the rear surface of the second sheet.

\* \* \* \* \*